(12) United States Patent
Smith

(10) Patent No.: US 6,191,711 B1
(45) Date of Patent: Feb. 20, 2001

(54) BINARY DATA COMPRESSION/DECOMPRESSION APPARATUS AND METHOD OF OPERATION FOR USE WITH MODEM CONNECTIONS

(75) Inventor: Kent W. Smith, Garland, TX (US)

(73) Assignee: Nortel Networks Ltd., Montreal (CA)

( * ) Notice: Under 35 U.S.C. 154(b), the term of this patent shall be extended for 0 days.

(21) Appl. No.: 09/258,027

(22) Filed: Feb. 25, 1999

(51) Int. Cl.$^7$ ............... H03M 7/04; H03M 7/12
(52) U.S. Cl. .................. 341/84; 341/50
(58) Field of Search ............... 341/50, 51, 106, 341/65, 67, 59, 60, 84

(56) References Cited

U.S. PATENT DOCUMENTS

| | | | | |
|---|---|---|---|---|
| 5,838,264 | * | 11/1998 | Cooper | 341/106 |
| 5,999,984 | * | 12/1999 | Fulcomer | 709/247 |
| 6,005,503 | * | 12/1999 | Burrows | 341/67 |
| 6,024,289 | * | 2/2000 | Ackley | 235/494 |
| 6,064,367 | * | 5/2000 | Horioka | 341/155 |

* cited by examiner

Primary Examiner—Peguy JeanPierre

(74) *Attorney, Agent, or Firm*—Bruce E. Garlick; James A. Harrison

(57) ABSTRACT

A system includes an input, a character set mapping function and a character set compression function. The input receives binary data that includes a plurality of binary data bits that may be organized into a plurality of binary data bytes. The character set mapping function maps the binary data bits into a predetermined character set to produce a plurality of characters. The character set compression function compresses the plurality of characters using a character set compression algorithm to produce a plurality of compressed characters. After compression of the character set data, the plurality of compressed characters may be modulated via a modem and transmitted across a data link to a receiving location. At the receiving location, a demodulator receives the modulated data and demodulates the modulated data to produce the plurality of compressed characters. Then, a character set decompression function decompresses the plurality of compressed characters to produce a plurality of characters. A binary data extraction function then extracts the binary data from the plurality of characters. In mapping the binary data bits into the predetermined character set to produce the plurality of characters, each N bytes of binary data are expanded into M one byte characters where N is an integer, M is an integer and M is larger than N. In a described embodiment, N is equal to three and M is equal to 4.

23 Claims, 7 Drawing Sheets

BINARY DATA COMPRESSION/DECOMPRESSION APPARATUS AND METHOD OF OPERATION FOR USE WITH MODEM CONNECTIONS

BACKGROUND

1. Technical Field

The present invention relates generally to communication systems; and more particularly to the compression and decompression of data within communication systems.

2. Related Art

The structure and operation of communication systems is generally known. Examples of such communication systems include the Public Switched Telephone Network (PSTN), wireless cellular systems, wireless satellite systems, packet switched networks such as the Internet and Asynchronous Transfer Mode (ATM) networks and Local Area Networks (LANs) among other communication systems. Early communication systems, such as the PSTN and analog wireless cellular systems originally serviced only voice communications. However, as the use of digital computers has advanced, these communication systems have been called upon to support both voice communications and data communications.

When wired communication systems were first called upon to carry digital data, modems were employed to modulate and demodulate the digital data upon an analog carrier signal. In these data communications, a first modem that coupled to a first computer communicated with a second modem that coupled to a second computer. The first modem coupled to the second modem via the wired communication system. This setup served to pass data communications between the computers and functioned adequately for early data communications. However, as the data rate (bits per second "bps") required for the data communications increased, shortcomings in the wired communication systems became evident.

The wired communication systems were initially designed to carry only voice communications. These voice communications required a bandwidth of approximately 8 khz which served as a design bandwidth for early communication systems, both wired and wireless. While many portions of modern communications now employ modern components and links having a greater bandwidth, legacy components remain. In particular, most present-day wired communication systems employ an analog communication link to couple telephones (and computer modems) to a central office. While this analog communication link provides more than adequate performance for voice communications, it presents a significant limitation for data communications passing thereupon. The analog communication link supports data communications at a maximum data rate of between 14 kbps and 33 kbps, and, in an exceptional case, 56 kpbs. Wireless links within wireless communication systems introduce similar bandwidth limitations.

While other portions of the communication systems now operate digitally and may provide greater bandwidth, the analog link from the modem to the local office of the telephone company is still commonly used to transmit data and comprises a weakest link. In a common data operation, a computer user employs his or her modem to dial-up an Internet Service Provider (ISP) to establish an Internet session. The computer user couples to his or her ISP via the analog link from his or her computer to the local office of the phone company. During this Internet session, the analog link serves to limit the available bandwidth for the Internet session. Resultantly, data transmissions are relatively slow and are often unreliable due to the properties of the analog link.

To overcome the bandwidth limitations of the analog link(s) in data communications, various techniques have been introduced. One such technique involves the local caching of data that may be downloaded multiple times. Such a technique is often used by browser software employed in Internet sessions. Other techniques involve the encoding/decoding and compression/decompression of data across the analog link(s). The success of these techniques, however, depends greatly upon the type of data being encoded/decoded or compressed/decompressed. For example, some character sets lend themselves to forms of compression/decompression that noticeably enhance apparent bandwidth provided by the analog link. However, for binary data, such compression/decompression and encoding/decoding techniques provide a lesser benefit.

Other techniques employed convert the analog link to another type of link. An example of this conversion is the Integrated Services Digital Network (ISDN) service that may be established between the local office and a computer user. However, the ISDN service requires additional hardware resources, is expensive to install and operate, and still provides a relatively low bandwidth (64 kbps/data channel). Another example of such a conversion of the data link is the Asynchronous Digital Subscriber Line (ADSL) service. Unfortunately, ADSL service suffers similar shortcomings. Moreover, the ISDN service and the ADSL service are provided only in limited geographic areas and cannot be provided over much existing copper wiring that services the analog links.

Thus, there exists a need in the art for a technique to increase the throughput of a communication links when the communication links are used to carry binary data.

SUMMARY OF THE INVENTION

Thus, to overcome the shortcomings of the prior systems and techniques, among other shortcomings, an apparatus that operates upon binary data transmitted across a communication link to increase throughput across the communication link includes an input, a character set mapping function and a character set compression function. The input receives binary data that includes a plurality of binary data bits that may be organized into a plurality of binary data bytes. The character set mapping function maps the binary data bits into a predetermined character set to produce a plurality of characters. The character set compression function compresses the plurality of characters using a character set compression algorithm to produce a plurality of compressed characters. After compression of the character set data, the plurality of compressed characters may be modulated via a modem and transmitted across a data link to a receiving location.

At the receiving location, a demodulator receives the modulated data and demodulates the modulated data to produce the plurality of compressed characters. Then, a character set decompression function decompresses the plurality of compressed characters to produce a plurality of characters. A binary data extraction function then extracts the binary data from the plurality of characters. Resultantly, the binary data that was input is reproduced at the output. However, by mapping/extracting the binary data to/from a character set and using a character set compression/decompression algorithm, significant performance gains are achieved.

In mapping the binary data bits into the predetermined character set to produce the plurality of characters, each N bytes of binary data are expanded into M one byte characters where N is an integer, M is an integer and M is larger than N. In a described embodiment, N is equal to three and M is equal to 4. The character set compression algorithm produces a compression ratio of M to 1. Thus, operation according to the present invention provides a compression ratio of three to one. According to this embodiment, six bits of binary data are mapped into an eight bit character and the predetermined character set comprises sixty-four characters, each of which is represented by six bits of data. In mapping the binary data to the character set, two bits of each eight bit character are data filled so that an optimum character set compression may be obtained.

According to the present invention, the apparatus may be embodied in various manners. In one embodiment, the input, the character set mapping function and the character set compression function comprise software instructions executable in conjunction with an application program. In another embodiment, the input, the character set mapping function and the character set compression function comprise hardware components. In still another embodiment, the input, the character set mapping function and the character set compression function comprise a combination of hardware components and software instructions.

These hardware and software components may further be embodied in various manners. In one particular embodiment, the input, the character set mapping function and the character set compression function are embodied upon a modem. However, in other embodiments, these components are embodied in device drivers and application programs, among other components whose operation may benefit from the compression/expansion of binary data.

Moreover, other aspects of the present invention will become apparent with further reference to the drawings and specification which follow.

BRIEF DESCRIPTION OF THE DRAWING

A better understanding of the present invention can be obtained when the following detailed description of the preferred embodiment is considered in conjunction with the following drawings, in which.

DETAILED DESCRIPTION OF THE DRAWINGS

Figure 1A:
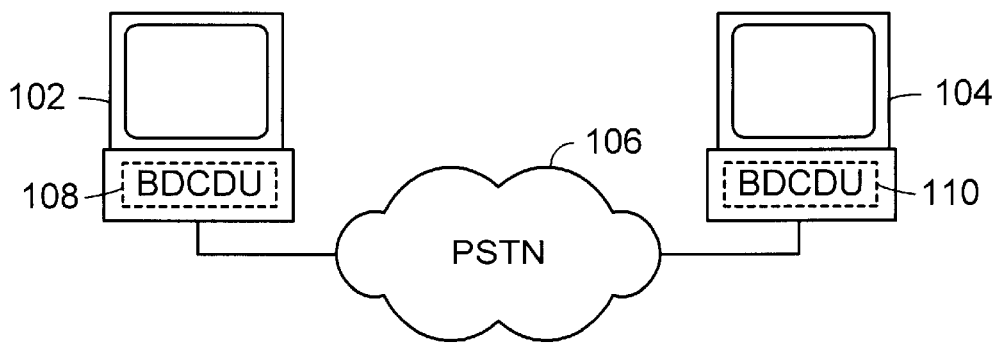
FIG. 1A is a block diagram illustrating generally a first computer and a second computer that pass binary data via the Public Switched Telephone Network (PSTN) and that each include a binary data compression/decompression unit constructed according to the present invention.

FIG. 1A is a block diagram illustrating generally a first computer and a second computer that pass binary via the Public Switched Telephone Network (PSTN) and that each include a binary data compression/decompression unit constructed according to the present invention. As shown, a first computer 102 couples to a second computer 104 via the PSTN 106 using an analog modem link. The PSTN 106 is shown for illustrative purposes only. The connection between the first computer 102 and the second computer 104 may be by way of any communication path over which binary data is passed between computers and across which efficiencies may be gained by compressing and decompressing binary data. Other examples of such a communication connection include a communication path having a wireless segment, an Integrated Services Digital Network (ISDN) segment and/or an Asynchronous Digital Subscriber Line (ADSL) segment, among others.

Each of the computers 102 and 104 includes a binary data compression/decompression unit (BDCDU) which supports binary data compression and decompression operations according to the present invention. As is shown, computer 102 includes BDCDU 108 while computer 104 includes BDCDU 110. The BDCDUs 108 and 110 operate in cooperation with one another to enable binary data to be compressed by a 3:1 ratio (or another ratio, depending upon the particular embodiment) for transmissions between the computers 102 and 104.

For transmissions of binary data from computer 102 to computer 104, the BDCDU 108 of computer 102 compresses the binary data. The compressed data is then transmitted across the PSTN 106 to computer 104. The BDCDU 110 of computer 104 receives the compressed data and expands the compressed data to its uncompressed form. Likewise, for transmissions of binary data from computer 104 to computer 102, the BDCDU 110 of computer 104 compresses the binary data, the compressed data is transmitted across the PSTN 106 to computer 102, and the BDCDU 108 of computer 102 receives the compressed data and expands the compressed data to its uncompressed form. Thus, a 3:1 increase in performance is achieved in the transmission of the binary data across the PSTN 106 according to the present invention as compared to prior binary data transmissions. These operations will be described in more detail with reference to FIGS. 2 through 6.

Figure 1B:
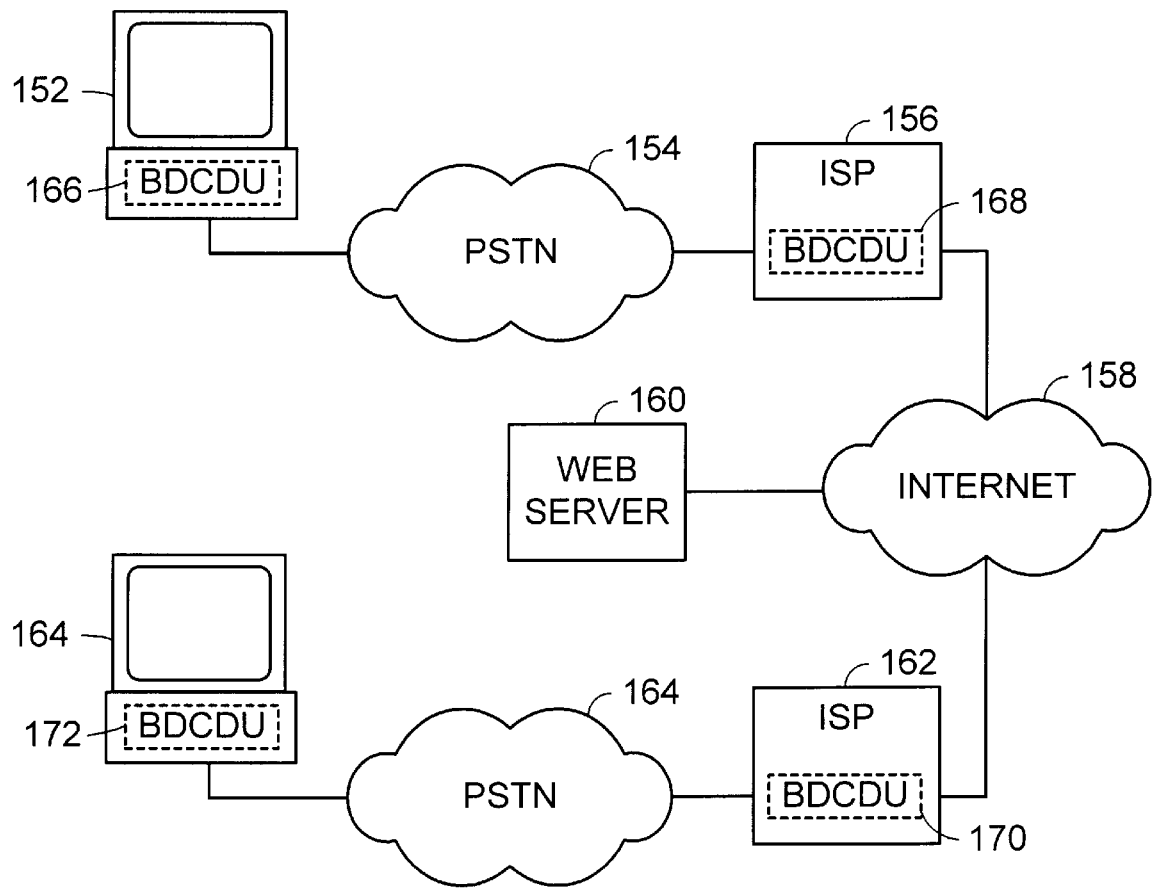
FIG. 1B is a block diagram illustrating generally a first computer, a second computer, a first Internet Service Provider and a second Internet Service Provider, each of which includes a binary data compression/decompression unit constructed according to the present invention.

FIG. 1B is a block diagram illustrating generally a first computer, a second computer, a first Internet Service Provider and a second Internet Service Provider, each of which includes a binary data compression/decompression unit constructed according to the present invention. As is generally known, most data transmission paths have a minimum bandwidth communication link which sets a lower limit on the performance obtainable across the data transmission path.

An example of activities requiring data communications occurs when computer 152 establishes an Internet session/data session with web server 160. In order to establish this session, the computer 152 establishes a communication link to Internet Service Provider (ISP) 156 via the PSTN 154. In such a communication link via the PSTN 154, an analog (or digital) modem contained in the computer 154 is used to communicate with an analog (or digital) modem contained in the ISP 156. The ISP 156 services a communication link to the web server 160 via the Internet 158. Independent of whether an analog modem or digital modem is employed, a maximum bandwidth may be provided by the communication link through the PSTN 154. In a typical scenario, the analog modem supports at most a 56 kbps communication link while a digital Integrated Services Digital Network (ISDN) modem supports at most a 128 kbps communication link. Thus, during many operations, the bandwidth provided by the Internet 158 and the ISP 156 between the web server 160 and the computer 152 exceeds the bandwidth provided by the communication link through the PSTN 154.

Thus, according to the present invention, the computer 152 and the ISP 156 include BDCDUs 166 and 168, respectively. These BDCDUs 166 and 168 service the communication link via the PSTN 154 to effectively increase the throughput of the communication link. In data communications with the web server 160, therefore, the computer 152 will not be limited by the bandwidth of the communication link across the PSTN 154, or will be limited to a lesser extent.

Also shown in FIG. 1B are a second computer 164 that includes a BDCDU 172 and another ISP 162 that includes a BDCDU 170 and which also couples to the Internet 158. In many binary data communications, an example of which is video teleconferencing, the first computer 152 establishes a data session directly with the second computer 164 via the Internet 158 (or multiple ISDN links via the PSTN 154, 164 without passing across the Internet 158). Thus, the communication path that services this binary data communication includes not only a communication link across the PSTN 154 between the first computer 152 and the first ISP 156 but a communication link across the PSTN 164 between the second computer 164 and the second ISP 156.

According to the present invention, the second computer 164 and the second ISP 164 also include BDCDUs, 172 and 170, respectively. These BDCDUs 172 and 170 compress and decompress the binary data to achieve a 3:1 compression ratio (or another compression ratio, depending upon the embodiment). Thus, the communication link across the PSTN 164 between the second computer 164 and the second ISP 156 supports a greater bandwidth of communications. Such a technique could be extended further for other components of a communication path as well, particularly those supported by analog and/or digital modems.

Figure 2:
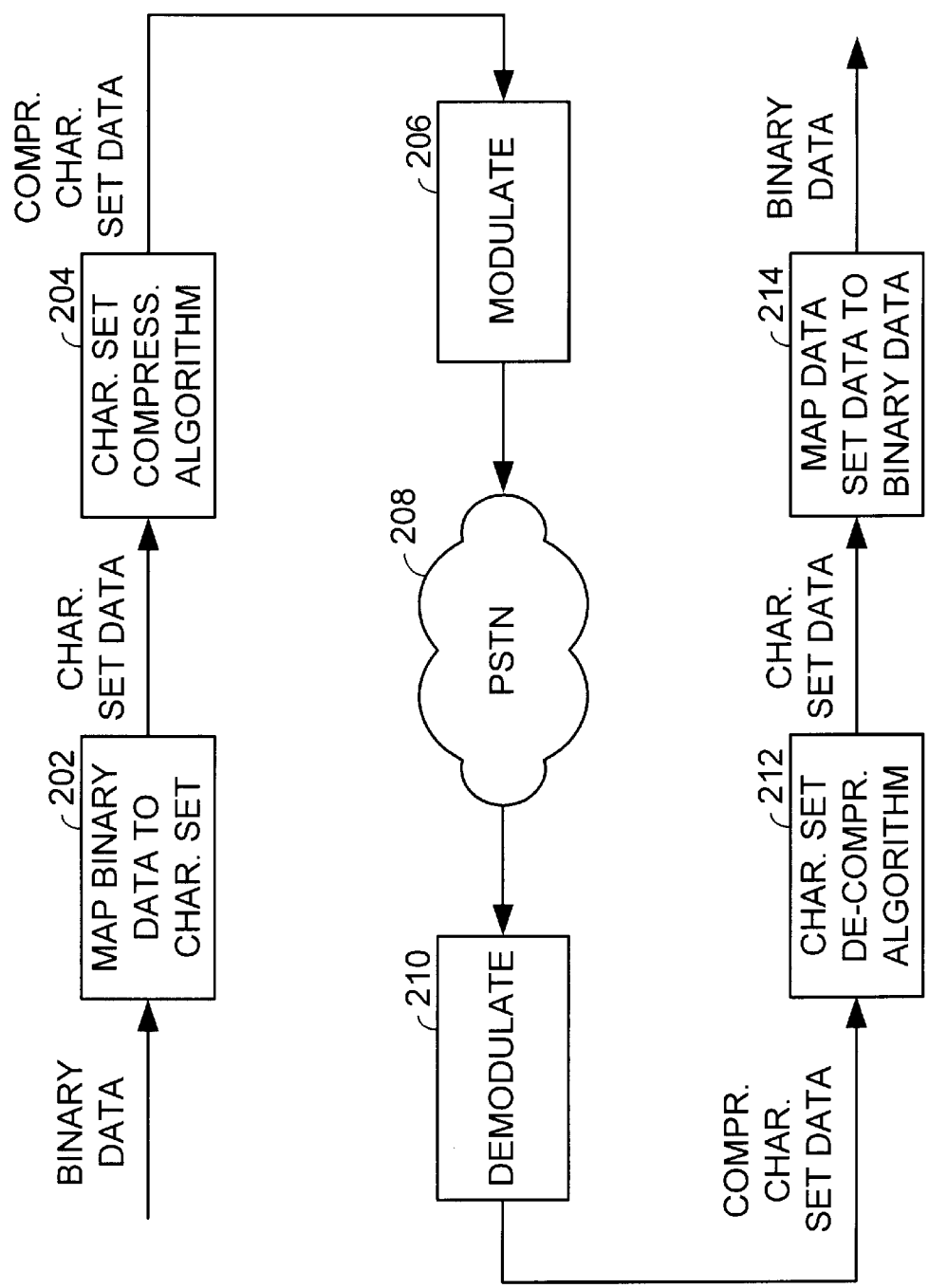
FIG. 2 is a block diagram illustrating the functional components of a binary data compression unit, the functional components of a binary data decompression unit, and the manner in which each of these functional components operates upon data according to the present invention.

FIG. 2 is a block diagram illustrating the functional components of a binary data compression unit, the functional components of a binary data decompression unit, and the manner in which each of these functional components operates upon data according to the present invention. Each of the functions (blocks) illustrated in FIG. 2 may be embodied in computer hardware, computer software, a modem, modem software or other digital hardware or software. Thus, the functions described generally with reference to FIG. 2 may be embodied in many differing fashions, each of which will not be described herein but will be generally identifiable to one of skill in the art.

Referring to the upper left portion of FIG. 2, binary data enters character set mapping function 202 at an input. The character set mapping function 202 maps binary data to character set data. According to one embodiment of the present invention, which will be further described with reference to FIGS. 5 and 6, six bits of binary data are mapped to an eight bit character set that supports 64 characters. Thus, only six bits of each eight bit character contain binary data. As is evident, therefore, in each mapping operation one byte of binary data is mapped to two eight bit characters such that portions of two separate bytes of binary data may be mapped to a single eight bit character. In the operation of the character set mapping function 202, therefore, a mapping ratio of 3:4 results in which the binary data is expanded into character set data.

Once the binary data is mapped/expanded into the character set data, the character set data is provided to a character set compression algorithm function 204 in which a character set compression algorithm is employed to compress the character set data. Resultantly, compressed character set data is produced. Examples of this character set compression may include compression algorithms based upon the works of Lempel, Ziv and Welch, commonly referred to as the LZW encoding method. A variation of this method is found in certain modem operating standards, such as the V.42bis standard, which is supported by many modems. However, other character set compression algorithms may be employed with the teachings of the present invention to compress the character set data to produce the compressed character set data.

The compressed character set data is then modulated via modulator 206 and coupled across the PSTN 208 to demodulator 210 which demodulates the compressed character set data. Modulation/demodulation may be performed using analog modems or digital modems, such modulation/demodulation limited only by the requirement that the modulation/demodulation be operable with the PSTN 208 (or another communication system) and with the other functional functions of FIG. 2. Subsequent to the demodulation via the demodulator 210, compressed character set data is received by a character set decompression function 212 which employs a character set decompression algorithm (consistent with the compression algorithm of character set compression function 204) to compress the compressed character set data. Resultantly, the character set decompression function 212 produces character set data which is the same as the character set data that was provided to character set compression function 204. Binary data extraction function 214 receives the character set data from the character set decompression function 212 and extracts the binary data from the character set data. The binary data is then forwarded to the computer program/computer component requiring such data.

As was described, in mapping binary data to character set data via the character set mapping function 202, an expansion ratio of 3:4 results. However, according to the LZW method, compression of the character set data by the ratio of 4:1 is obtainable. Thus, a net compression ratio of 3:4*4:1= 3:1 is obtainable using the technique described herein. This compression ratio provides a significant performance advantage as compared to the prior technique of modulating/demodulating the binary data directly.

Figure 3:
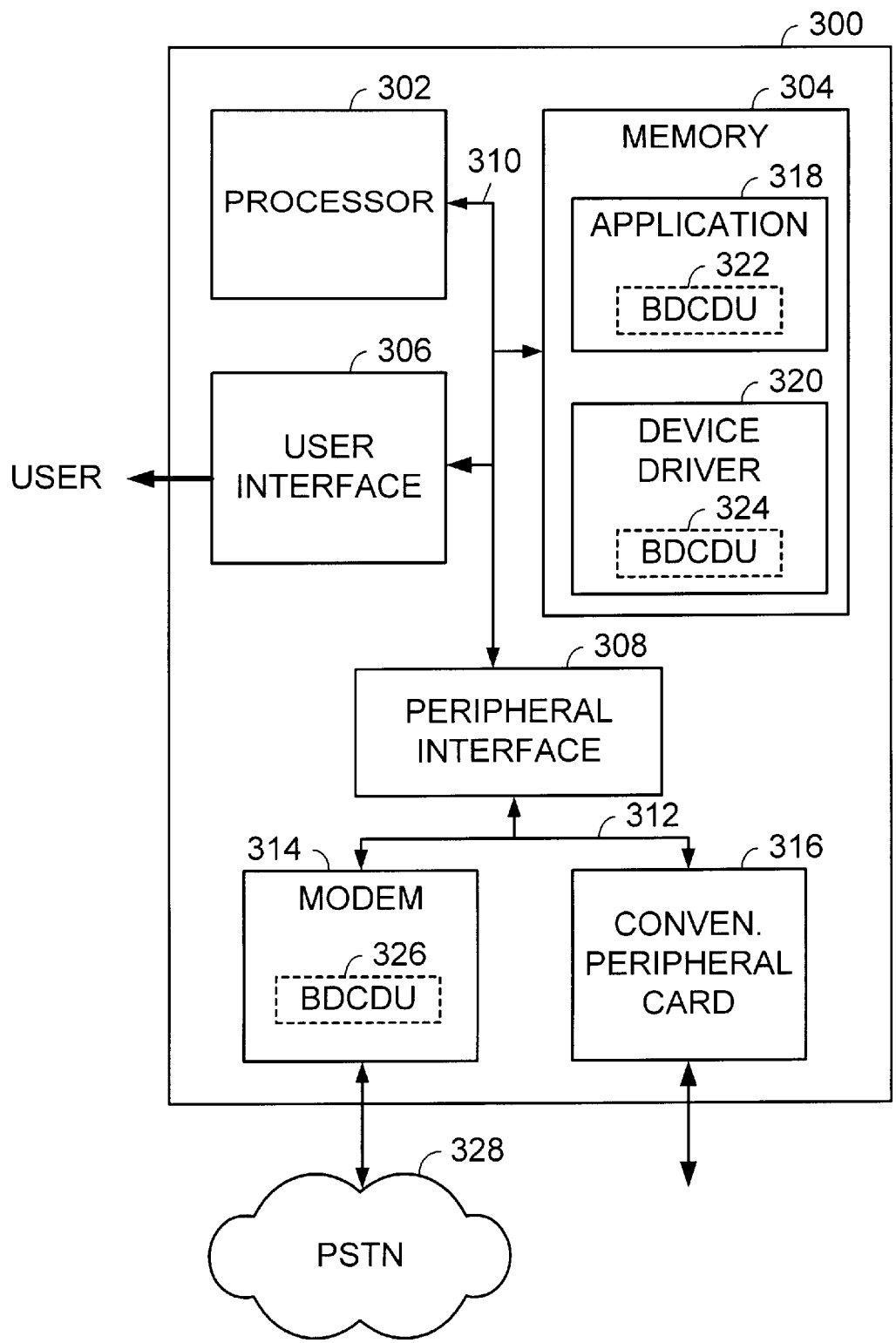
FIG. 3 is a block diagram illustrating generally the components of a digital computer, including a modem, and the differing manners in which a binary data compression/decompression unit may be embodied upon thereupon according to the present invention.

FIG. 3 is a block diagram illustrating generally the components of a digital computer and the differing manners in which a binary data compression/decompression unit may be embodied upon such a digital computer. The digital computer 300 is shown generally to be constructed according to a standard architecture in which a processor 302, memory 304, user interface 306 and peripheral interface 308 intercouple via a processor bus 310. The peripheral interface 308 couples the processor bus 310 to a modem 314 and to at least one other conventional interface card 316 via a peripheral bus. The peripheral bus 312 may support ISA, PCMCIA, PCI or other standards. Application programs 318 and device drivers 320 reside in memory 304 and are executed by the processor 302 during operations of the digital computer 300. The architecture shown is a variation of an architecture oftentimes employed in personal computers. However, other architectures could also be employed without departing from the spirit and scope of the present invention.

As is shown, a BDCDU constructed according to the present invention may reside in various locations within the digital computer 300. Depending upon the particular construction, the BDCDU may be embodied in hardware, software or a combination of the two. In a first particular construction, a BDCDU 326 resides upon the modem 314 in software and/or hardware. Constructed in this fashion, operation of the BDCDU 326 is transparent to application programs 318 and the device driver 320 that operates the modem 314 via the peripheral interface 308.

In another embodiment, a BDCDU 318 resides within an application 318 stored in the memory 304. Thus, when the processor 302 executes the instructions of the application 318, it may also execute instructions that embody the BDCDU 322. In such case, operation of the BDCDU 322 may be transparent to both the device driver 320 and the modem 314. In one operation, the BDCDU 322 simply converts binary data to character set data and directs the character set data to the modem 314 via the device driver 320, with the device driver 320 or the modem 314 performing compression of the character set data.

In still another embodiment, a BDCDU 324 resides within a device driver 320 that drives the operations of the modem 314. In such case, operation of the BDCDU 324 may be transparent to both the application 318 and the modem 314. In a particular operation of the BDCDU 324 in which compression is not performed by the BDCDU 324, the BDCDU 324 converts binary data to character set data and passes the character set data to the modem 314 with the modem 314 performing compression of the character set data.

Figure 4:
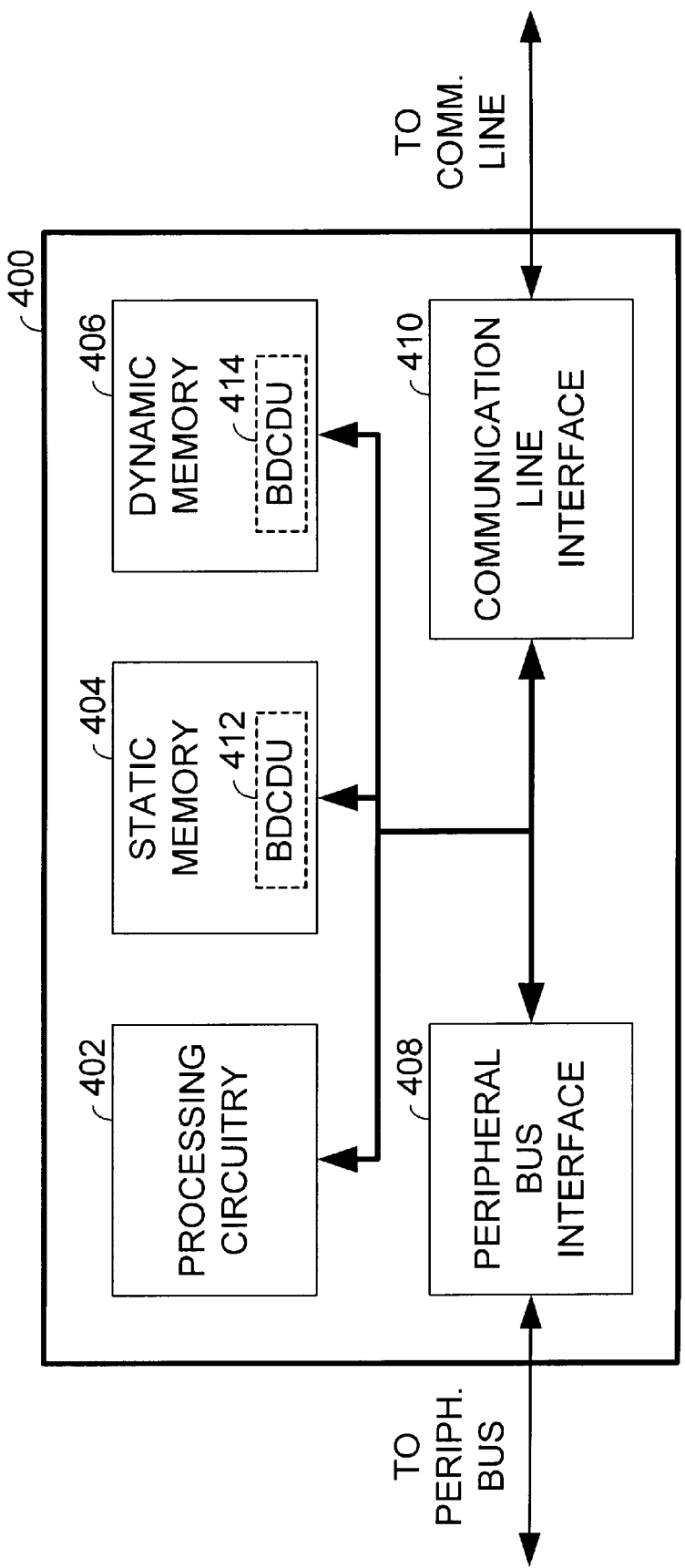
FIG. 4 is a block diagram illustrating generally the components of a modem constructed according to the present invention.

FIG. 4 is a block diagram illustrating generally the components of a modem constructed according to the present invention. As shown, the modem 400 includes processing circuitry 402, static memory 404, dynamic memory 406, a peripheral bus interface 408 and a communication line interface 410. The modem may be compliant with a particular bus interface standard, e.g., ISA, PCI, PCMCIA, etc. or may couple to computer via a parallel port, a serial port or another bus or port.

Contained upon the static memory 404 and/or the dynamic memory 406 are BDCDUs 412 and 414, respectively. These BDCDUs 412 and 414 are embodied as computer software instructions that are processed by the processing circuitry 402 to perform operations according to the present invention. In such case, binary data is received by the peripheral bust interface 408 from the peripheral bus, converted to character set data, compressed using a character set algorithm, modulated and transmitted via the communication line interface 410 upon a communication line.

Upon receipt, by another modem constructed similar to, or the same as the modem 400, the compressed and modulated data is demodulated to produce compressed character set data. The compressed character set data is then decompressed to produce character set data. The binary data is then extracted from the character set data. Thus, the modem 400 is capable of operate according to the present invention in both transmitting and receiving binary data.

Figure 5:
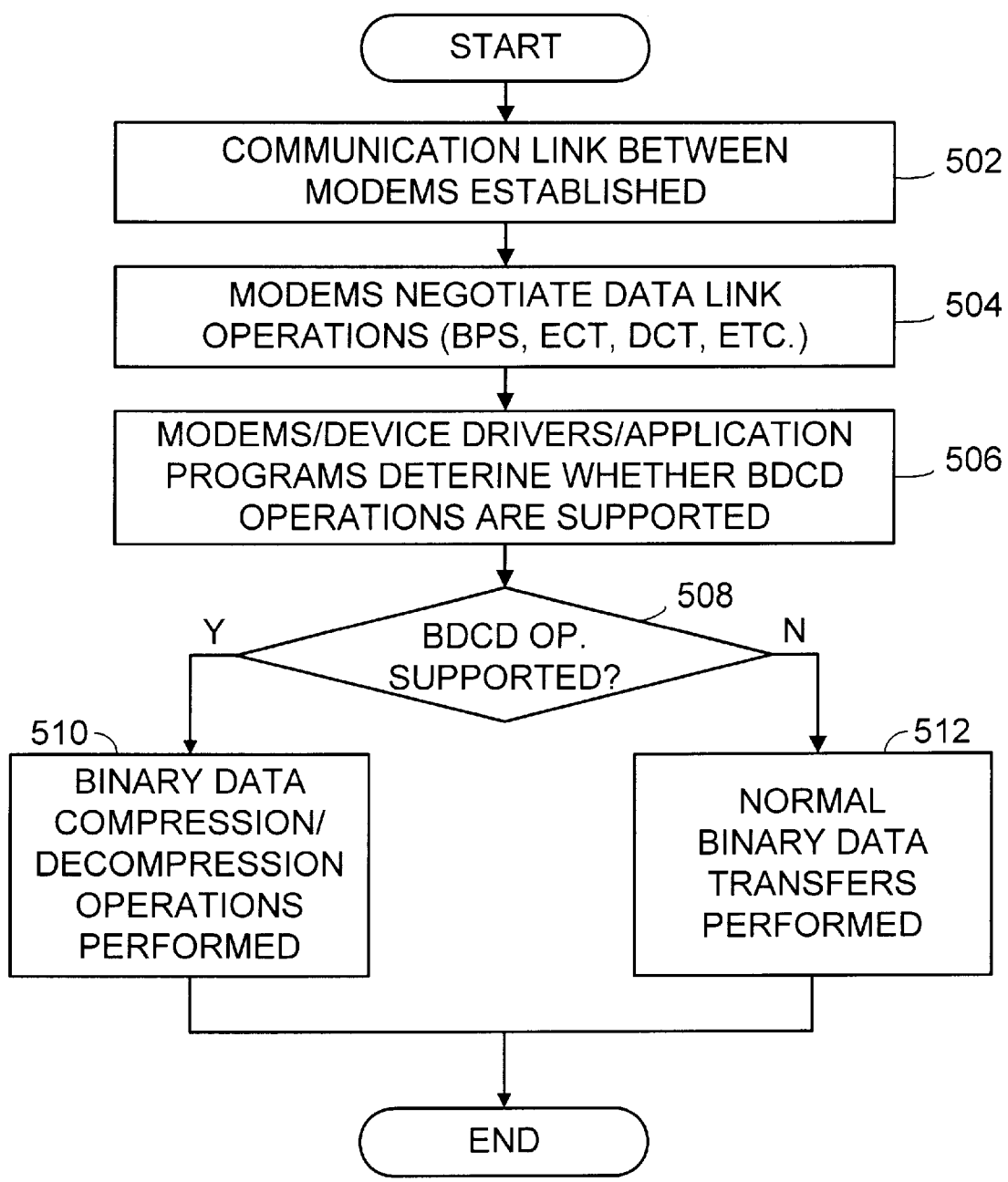
FIG. 5 is a logic diagram generally illustrating operation according to the present invention in which binary data compression and decompression operations are established and services via a modem link according to the present invention.

FIG. 5 is a logic diagram generally illustrating operation according to the present invention in which two digital components initiate binary data compression and decompression operations via a modem link according to the present invention during a data session. A first operation occurs at step 502 in which a communication link is established between the modems. Such communication link is first established by one of the modems interacting with the PSTN (or other connecting communication system) to initially connect with the other modem. As was previously described with reference to FIGS. 1A and 1B, operation according to the present invention presupposes that a data link has established across a bandwidth limited link. A common embodiment of such link establishment is, of course, a link between a modem pair via the PSTN.

Then, at step 504, the modems negotiate link operations. When initially establishing the link, the two modems first identify their common capabilities by exchanging signals among one another until a set of signals is recognized by one of the modems and responded to by the other modem indicating a compatible connection protocol has been identified. The protocol identified is used to determine the bits-per-second (bps) data transfer rate, error correction techniques, and data compression techniques used for the connection. Once this link has been established, communication between the two modems is possible.

At step 506 the modems/device drivers/application programs in use on the respective coupled computers determine whether binary data compression decompression (BDCD) operations according to the present invention are supported. If it is determined that BDCD operations are supported at step 508, operation proceeds to step 510 where BDCD operations are performed upon binary data that is to be passed between the coupled computers. However, if at step 508 it is determined that BDCD operations are not supported by the modems/device drivers/application programs in use on the respective coupled computers, normal binary data transfers are performed at step 512 between the coupled computers. From both steps 510 and 512, operation ends.

Figure 6:
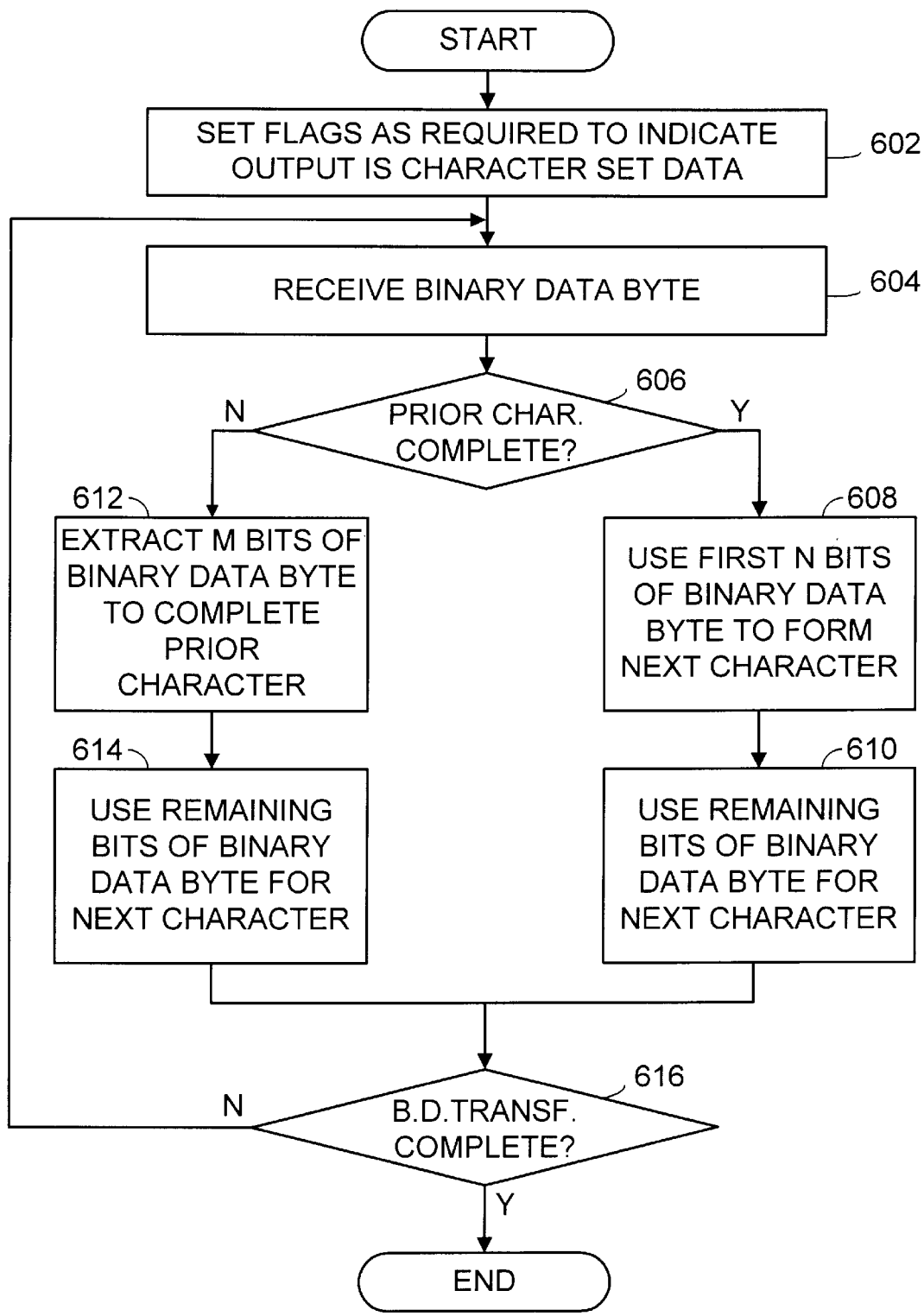
FIG. 6 is a logic diagram generally illustrating operation according to the present invention in mapping binary data to character set data so that the character set data may be subsequently compressed using a character set compression algorithm.

FIG. 6 is a logic diagram generally illustrating operation according to the present invention in mapping binary data to character set data, the character set data subsequently compressed using a character set compression algorithm. Operations commence at step 602 wherein flags are set (or continually set) to indicate that the output produced in the conversion operations is character set data. Such flags are set to notify a device driver and/or a modem that the data received is character set data. With this indication received, the device driver and/or modem may use its character set compression algorithms to compress the character set data prior to transmission.

Operation proceeds to step 604 wherein a binary data byte is received. Upon receipt, operation proceeds to step 606 where it is determined whether the prior character has been completed. If so, operation proceeds to step 608 where the first N bits of the current binary data byte is used to form the next character of the character set data. Then, at step 610, the remaining bits of the byte of binary data are used to form a first portion of the next character. From step 610, operation proceeds to step 616 where it is determined whether the binary data transfer is complete. If so, operation ends. If not, operation returns to step 604.

If at step 606 it is determined that the prior character of character set data is not complete, operation proceeds to step 612 where the first M bits of the current byte of binary data are extracted to complete the prior character. Then, at step 614 the remaining bits of the byte of binary data are used to form all or a portion of the next character of the character set data. From step 614, operation proceeds to step 616.

Figure 7:
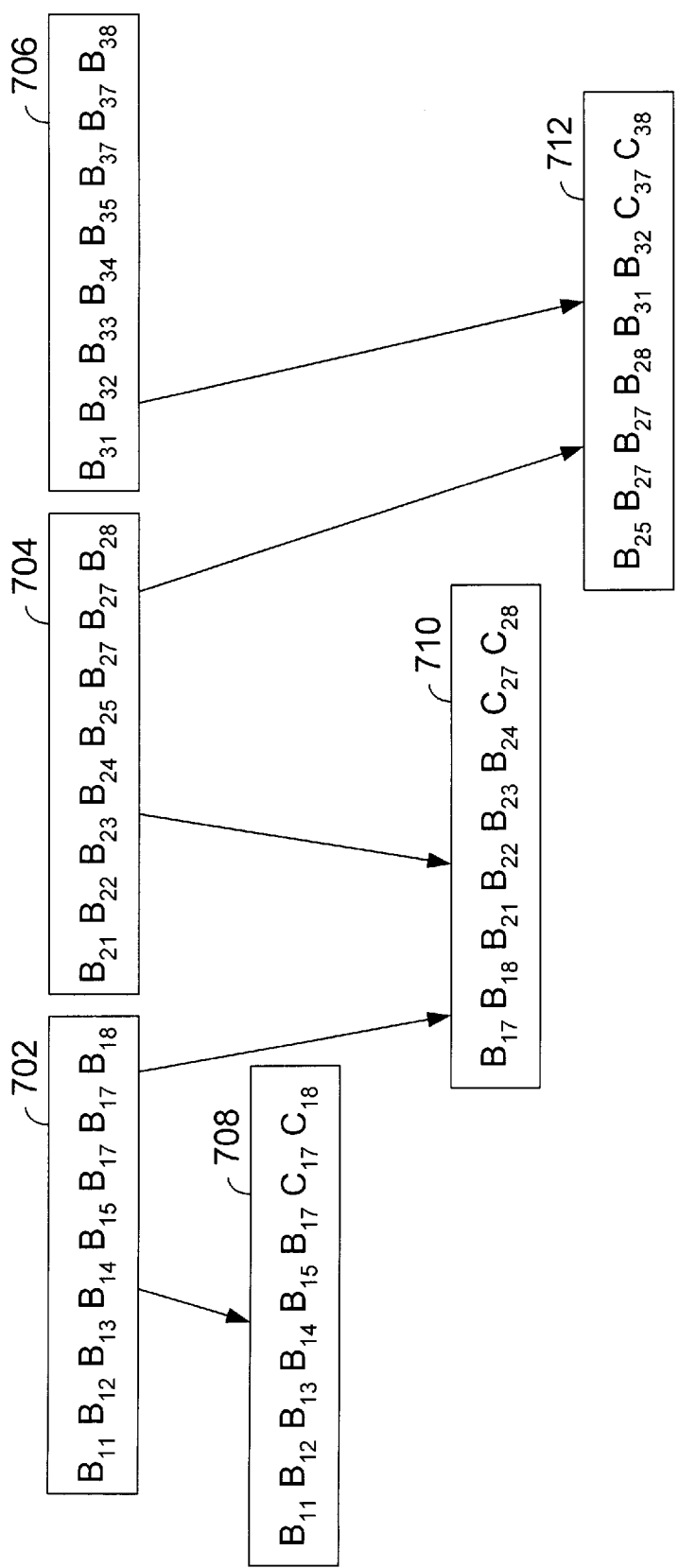
FIG. 7 is a block diagram symbolically illustrating a particular the mapping of eight bit binary data to character set data according to the present invention.

FIG. 7 is a block diagram illustrating a particular embodiment of the present invention in mapping eight bit binary data to character set data that will subsequently be compressed for transmission. As is shown, a first byte of binary data 702 includes binary data bits $B_{11}$ through $B_{18}$. In converting binary data to character set data, the first six bits $B_{11}$ through $B_{16}$ of the binary data byte 702 are used to form the first six bits of the character 708. The remaining two bits of the character 708 are data filled with character bits $C_{17}$ and $C_{18}$. As is known in the data compression art, the bit settings for the fill bits $C_{17}$ and $C_{18}$, as well as other fill bits, may be set to particular values to aid in the compressibility of the resulting characters.

Subsequently, the last two bits $B_{17}$ and $B_{18}$ of the binary data byte 702 are used to form the first two bits of the second character 710. Further, the first four bits $B_{21}$ through $B_{24}$ of the second byte of binary data 704 are used to form the third through sixth bits of the second character 710. Likewise, the last two bits of the second character 710 are data filled with character bits $C_{27}$ and $C_{28}$.

Further still, the last four bits $B_{25}$ through $B_{28}$ of the binary data byte 704 are used to form the first four bits of the third character 712 while the first two bits $B_{31}$ and $B_{32}$ of the binary data byte 706 are used to form the fifth and sixth bits of the third character 712. The last two bits of the third character 712 are data filled with character bits $C_{37}$ and $C_{38}$. As is evident, these operations may be repeated for the complete binary data transmission to create character set data.

The invention disclosed herein is susceptible to various modifications and alternative forms. Specific embodiments therefor have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A method for operating upon binary data transmitted across a communication link to increase throughput across the communication link, the method comprising:

receiving binary data on a transmitting side of the data link, wherein the binary data includes a plurality of binary data bits that are organized into a plurality of binary data bytes;

mapping the binary data bits into a predetermined character set to produce a plurality of characters of the predetermined character set, wherein mapping the binary data bits into the predetermined character set includes;

for a first character of the predetermined character set, extracting a first partial set of binary data bits from a first binary data byte, inserting the first partial set of data bits from the first binary data byte into the first character, wherein the first character includes a number of bits greater than a number of bits of the first partial set of binary data bits from the first binary data byte, and filling unfilled bits of the first character so that the first character is one of the predetermined character set;

for a second character of the predetermined character set, extracting a second partial set of binary data bits from the first binary data byte and extracting a third partial set of binary data bits from a second binary data byte, inserting the second partial set of data bits and the third partial set of binary data bits into the second character, and filling unfilled bits of the second character so that the second character is one of the predetermined character set;

compressing the plurality of characters using a character set compression algorithm to produce a plurality of compressed characters; and transmitting the plurality of compressed characters across the communication link.

2. The method of claim 1, wherein in mapping the binary data bits into the predetermined character set to produce the plurality of characters, each N bytes of binary data is expanded into M one byte characters where N is an integer, M is an integer and M is larger then N.

3. The method of claim 2, wherein N is equal to three and M is equal to 4.

4. The method of claim 2, wherein compressing the plurality of characters using a character set compression algorithm to produce a plurality of compressed characters produces a compression ratio of M to 1.

5. The method of claim 4, wherein N is equal to three and M is equal to four such that compression of the binary data is performed at a ratio of three to one.

6. The method of claim 1, wherein:

six bits of binary data are mapped into an eight bit character; and the predetermined character set comprises sixty-four characters, each of which is represented by six bits of data.

7. The method of claim 6, wherein two bits of each eight bit character are data filled so that an optimum character set compression may be obtained.

8. The method of claim 1, further comprising passing the plurality of compressed characters across the communication link.

9. The method of claim 8, further comprising:

receiving the plurality of compressed characters from the communication link;

decompressing the plurality of compressed characters to produce a plurality of characters of the predetermined character set; and extracting the binary data from the plurality of characters.

10. The method of claim 1, wherein the character set compression algorithm comprises V.42bis compression.

11. An apparatus that operates upon binary data to be transmitted across a communication link to increase throughput across the communication link, the apparatus comprising:

an input that receives binary data on a transmitting side of the data link, wherein the binary data includes a plurality of binary data bits that are organized into a plurality of binary data bytes;

a character set mapping function that maps the binary data bits into characters of a predetermined character set to produce a plurality of characters of the predetermined character set, wherein mapping the mapping function maps binary data bits into the predetermined character set by:

for a first character of the predetermined character set, extracting a first partial set of binary data bits from a first binary data byte, inserting the first partial set of data bits from the first binary data byte into the first character, wherein the first character includes a number of bits greater than a number of bits of the first partial set of binary data bits from the first binary data byte, and filling unfilled bits of the first character so that the first character is one of the predetermined character set;

for a second character of the predetermined character set, extracting a second partial set of binary data bits from the first binary data byte and extracting a third partial set of binary data bits from a second binary data byte, inserting the second partial set of data bits and the third partial set of binary data bits into the second character, and filling unfilled bits of the second character so that the second character is one of the predetermined character set; and a character set compression function that compresses the plurality of characters using a character set compression algorithm to produce a plurality of compressed characters.

12. The apparatus of claim 11, wherein in mapping the binary data bits into the predetermined character set to produce the plurality of characters, each N bytes of binary data are expanded into M one byte characters where N is an integer, M is an integer and M is larger than N.

13. The apparatus of claim 12, wherein N is equal to three and M is equal to four.

14. The apparatus of claim 12, wherein the character set compression function uses a character set compression algorithm to produce a plurality of compressed characters produces a compression ratio of M to one.

15. The apparatus of claim 14, wherein N is equal to three and M is equal to four such that compression of the binary data is performed at a ratio of three to one.

16. The apparatus of claim 11, wherein:

six bits of binary data are mapped into an eight bit character; and the predetermined character set comprises sixty-four characters, each of which is represented by six bits of data.

17. The apparatus of claim 16, wherein two bits of each eight bit character are data filled so that an optimum character set compression may be obtained.

18. The apparatus of claim 11, further comprising a modem which modulates the compressed character set data to produce modulated data and couples modulated data across the communication link.

19. The apparatus of claim 18, further comprising:

a demodulator that receives the modulated data and demodulates the modulated data to produce the plurality of compressed characters;

a character set decompression function that decompresses the plurality of compressed characters to produce a plurality of characters; and a binary data extraction function the extracts the binary data from the plurality of characters.

20. The apparatus of claim 11, wherein the input, the character set mapping function and the character set compression function comprise software instructions executable in conjunction with an application program.

21. The apparatus of claim 11, wherein the input, the character set mapping function and the character set compression function comprise hardware components.

22. The apparatus of claim 11, wherein the input, the character set mapping function and the character set compression function comprise a combination of hardware components and software instructions.

23. The apparatus of claim 11, wherein the input, the character set mapping function and the character set compression function are embodied upon a modem.

* * * * *